US012768047B2

(12) United States Patent
Kiyosawa et al.

(10) Patent No.: US 12,768,047 B2
(45) Date of Patent: Oct. 20, 2026

(54) VAPOR PHASE GROWTH APPARATUS AND FILM FORMATION METHOD

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tsutomu Kiyosawa, Himeji (JP); Masaharu Shimabayashi, Ibo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 19/055,618

(22) Filed: Feb. 18, 2025

(65) Prior Publication Data

US 2026/0062810 A1 Mar. 5, 2026

(30) Foreign Application Priority Data

Aug. 30, 2024 (JP) ................................ 2024-149832

(51) Int. Cl.
*C23C 16/46* (2006.01)
*C23C 16/458* (2006.01)
*C23C 16/52* (2006.01)

(52) U.S. Cl.
CPC ............ *C23C 16/46* (2013.01); *C23C 16/458* (2013.01); *C23C 16/4584* (2013.01);
(Continued)

(58) Field of Classification Search
CPC ... C23C 16/46; C23C 16/458; C23C 16/4584; C23C 16/4585; C23C 16/4586; C23C 16/52; C23C 16/325
See application file for complete search history.

(56) References Cited

U.S. PATENT DOCUMENTS 10,508,363 B2 * 12/2019 Yamada ............. C23C 16/4585
2012/0325138 A1 12/2012 Suzuki et al.
(Continued)

FOREIGN PATENT DOCUMENTS

JP 2024017276 A 2/2024
WO WO-9832893 A2 * 7/1998 .......... H10P 72/7626

*Primary Examiner* — Jeffrie R Lund
(74) *Attorney, Agent, or Firm* — Maier & Maier, PLLC

(57) ABSTRACT

A vapor phase growth apparatus of an embodiment has a susceptor supporting a wafer, and a ring-shaped wafer guide surrounding the wafer. The susceptor has a wafer support portion supporting the wafer from below, a guide support portion supporting the wafer guide from below, and an inward portion positioned on an inward side in a radial direction from the wafer support portion. An upper surface of the inward portion is positioned below a wafer contact surface of the wafer support portion. The wafer contact surface is positioned above a guide contact surface of the guide support portion. During film formation processing, a control unit measures a temperature of a part in the wafer overlapping the wafer support portion by a first temperature sensor, measures a temperature of a part in the wafer overlapping the inward portion by a second temperature sensor.

15 Claims, 9 Drawing Sheets

(52) U.S. Cl.
CPC ...... *C23C 16/4585* (2013.01); *C23C 16/4586* (2013.01); *C23C 16/52* (2013.01)

(56) References Cited

U.S. PATENT DOCUMENTS

| | | | | |
|---|---|---|---|---|
| 2013/0036968 | A1 | 2/2013 | Suzuki et al. | |
| 2015/0299898 | A1 | 10/2015 | Ito et al. | |
| 2016/0024652 | A1 | 1/2016 | Ito et al. | |
| 2018/0066381 | A1 | 3/2018 | Ishikawa et al. | |
| 2020/0080230 | A1 | 3/2020 | Yamada et al. | |
| 2020/0185220 | A1 | 6/2020 | Daigo | |
| 2021/0292897 | A1 | 9/2021 | Daigo | |
| 2023/0257904 | A1 | 8/2023 | Daigo et al. | |
| 2023/0304187 | A1 | 9/2023 | Moriyama et al. | |
| 2026/0062810 | A1* | 3/2026 | Kiyosawa | C23C 16/4584 |
| 2026/0068598 | A1* | 3/2026 | Kiyosawa | H10P 14/2926 |
| 2026/0078491 | A1* | 3/2026 | Kiyosawa | C23C 16/325 |

* cited by examiner

VAPOR PHASE GROWTH APPARATUS AND FILM FORMATION METHOD

CROSS-REFERENCE TO RELATED APPLICATION

Priority is claimed on Japanese Patent Application No. 2024-149832, filed Aug. 30, 2024, the content of which is incorporated herein by reference.

FIELD

An embodiment of the present invention relates to a vapor phase growth apparatus and a film formation method.

BACKGROUND

Vapor phase growth apparatus for forming a film on a surface of a wafer are known. In such vapor phase growth apparatus, during film formation processing of forming a film on a surface of a wafer, a susceptor having a wafer mounted thereon is rotated while being heated.

During such film formation processing, there is concern that variation in the thickness of a film formed on a wafer may increase, variation in the carrier concentration of a film formed on a wafer may increase, or the like due to trouble, for example, an offset wafer causing an outer edge of the wafer to enter a gap between a ring-shaped wafer guide, which surrounds the outer edge of the wafer, and the susceptor, significant variation in temperature of a heated wafer, or the like, which may result in degradation of film formation accuracy of a film formed on a wafer.

DETAILED DESCRIPTION

Figure 1:
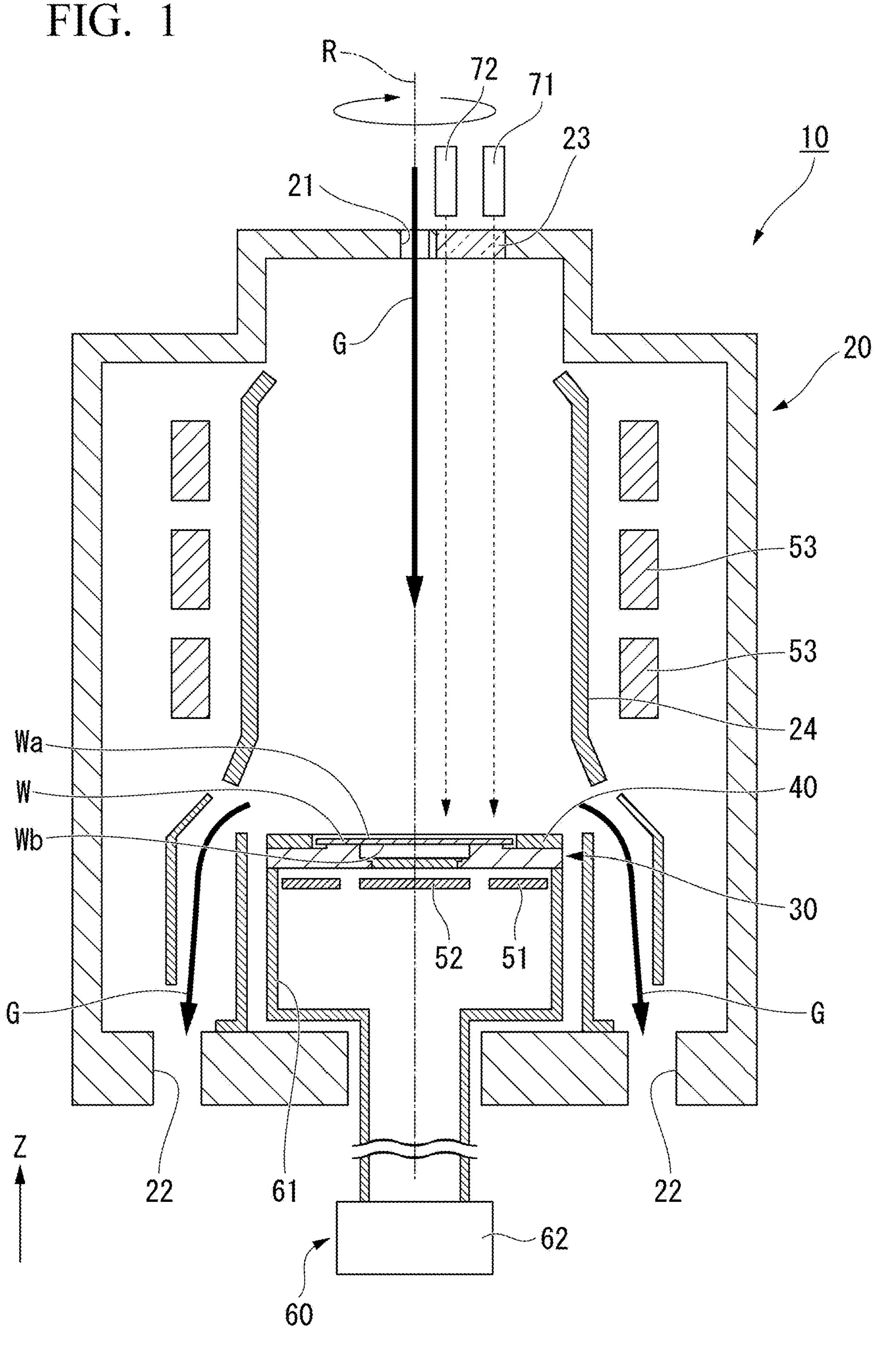
FIG. 1 is a cross-sectional view showing a vapor phase growth apparatus of a first embodiment.

A vapor phase growth apparatus of an embodiment is a vapor phase growth apparatus for forming a film on a surface of a wafer. The vapor phase growth apparatus of the embodiment has a susceptor supporting the wafer from below, a drive unit rotating the susceptor around a rotation axis extending in a vertical direction, a ring-shaped wafer guide supported by the susceptor from below and surrounding an outer edge of the wafer, a first temperature sensor and a second temperature sensor capable of measuring a temperature of the wafer, a first heating portion and a second heating portion capable of heating the susceptor, and a control unit controlling the first heating portion and the second heating portion. The susceptor has a wafer support portion supporting the wafer from below, a guide support portion positioned on an outward side from the wafer support portion in a radial direction about the rotation axis and supporting the wafer guide from below, and an inward portion positioned on an inward side in the radial direction from the wafer support portion. The wafer support portion has a wafer contact surface coming into contact with the wafer. An upper surface of the inward portion is positioned below the wafer contact surface. The guide support portion has a guide contact surface coming into contact with the wafer guide. The wafer contact surface is positioned above the guide contact surface. The first heating portion is positioned on the outward side in the radial direction from the second heating portion. During film formation processing of forming a film on a surface of the wafer, the control unit measures a temperature of a part in the wafer overlapping the wafer support portion when viewed in the vertical direction by the first temperature sensor, measures a temperature of a part in the wafer overlapping the inward portion when viewed in the vertical direction by the second temperature sensor, and controls the first heating portion and the second heating portion on the basis of measurement results of the first temperature sensor and measurement results of the second temperature sensor.

Hereinafter, a vapor phase growth apparatus and a film formation method of an embodiment will be described with reference to the drawings. In the drawings, a Z axis indicating a vertical direction is suitably indicated. A side which the Z axis arrow faces (positive Z side) is an upward side in the vertical direction, and a side opposite to the side which the Z axis arrow faces (negative Z side) is a downward side in the vertical direction. In the following description, the vertical direction will be referred to as "a vertical direction Z", and the upward side in the vertical direction Z will be simply referred to as "the upward side", and the downward side in the vertical direction Z will be simply referred to as "the downward side". In addition, in the drawings, a rotation axis R extending in the vertical direction Z is suitably indicated. The rotation axis R is a virtual line. In the following description, unless otherwise specified, a radial direction about the rotation axis R will be simply referred to as "a radial direction", and a circumferential direction around the rotation axis R will be simply referred to as "a circumferential direction".

First Embodiment

Figure 2:
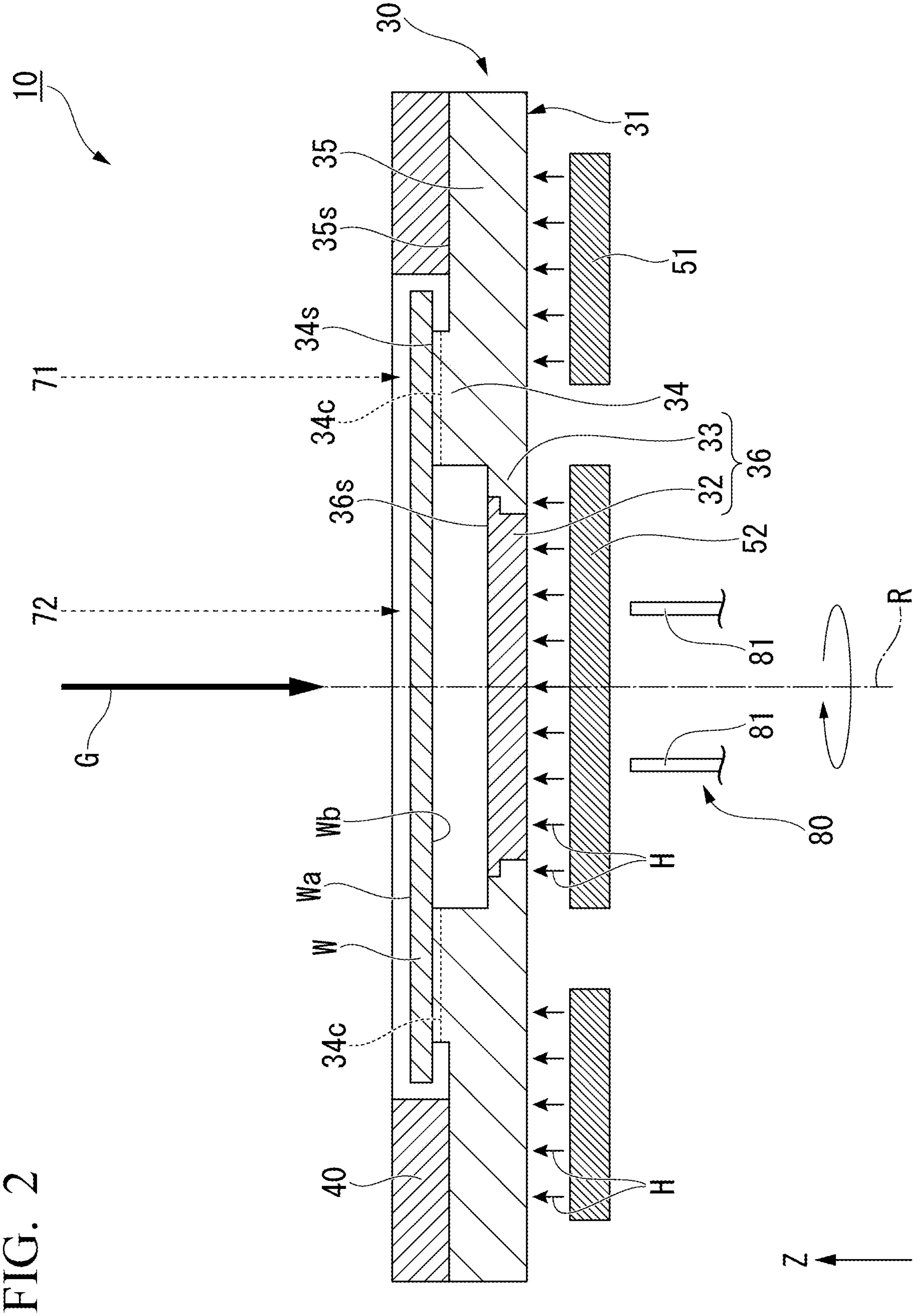
FIG. 2 is a cross-sectional view showing a part of the vapor phase growth apparatus of the first embodiment.
Figure 3:
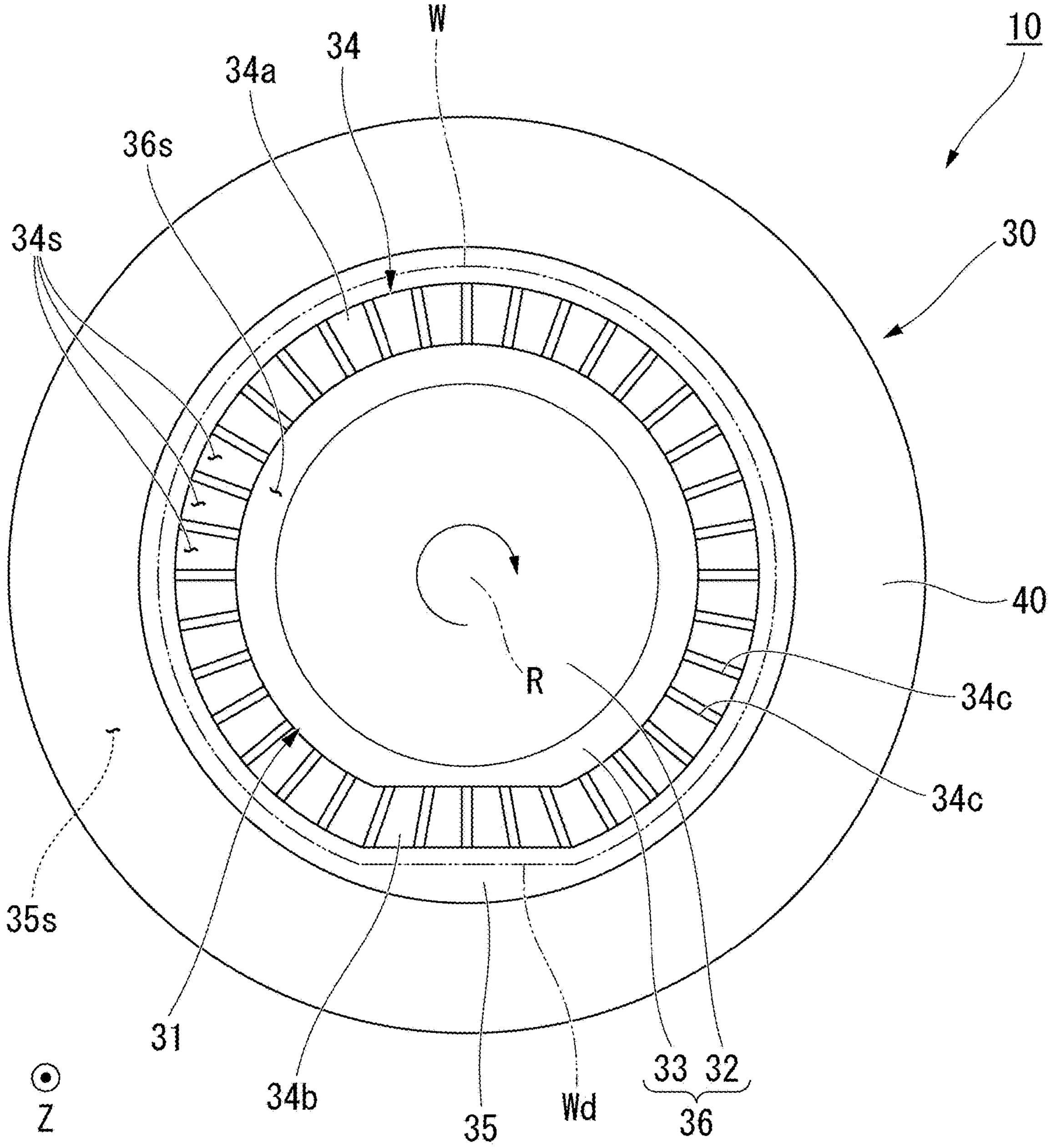
FIG. 3 is a view of a part of the vapor phase growth apparatus of the first embodiment viewed from above.

FIG. 1 is a cross-sectional view showing a vapor phase growth apparatus 10 of a first embodiment. FIG. 2 is a cross-sectional view showing a part of the vapor phase growth apparatus 10 of the first embodiment. FIG. 3 is a view of a part of the vapor phase growth apparatus 10 of the first embodiment viewed from above. In FIG. 3, the outer shape of a wafer W is indicated by a two-dot dashed line. The vapor phase growth apparatus 10 shown in FIGS. 1 to 3 is a device for forming a film on a surface of the wafer W. In the vapor phase growth apparatus 10, for example, an epitaxial film is formed on the surface of the wafer W by a chemical vapor deposition (CVD) method. For example, the film formed on the surface of the wafer W is a film constituted by silicon carbide (SiC), that is, a SiC film. The film formed on the surface of the wafer W may be a film constituted by a different material such as Si. For example, the wafer W is formed of silicon carbide (SIC). The wafer W may be formed of a different material such as silicon (Si). As shown in FIG. 3, the wafer W has substantially a disk shape. A part of an outer edge of the wafer W is an orientation flat portion Wd extending linearly. For example, the orientation flat portion Wd shows a crystal orientation of a material constituting the wafer W. Other parts of the outer edge of the wafer W have an arc shape. The wafer W is disposed inside the vapor phase growth apparatus 10 in a state where a surface Wa on which a film is formed faces upward and a rear surface Wb on a side opposite to the surface Wa faces downward.

As shown in FIG. 1, the vapor phase growth apparatus 10 includes a chamber 20, a supply tube 24, a susceptor 30, a wafer guide 40, first heating portions 51, a second heating portion 52, third heating portions 53, a drive unit 60, a first temperature sensor 71, and a second temperature sensor 72.

The chamber 20 internally accommodates the supply tube 24, the susceptor 30, the wafer guide 40, the first heating portions 51, the second heating portion 52, the third heating portions 53, and the drive unit 60. For example, the chamber 20 is made of metal such as stainless steel (SUS). The chamber 20 has a tubular shape extending in the vertical direction Z. A supply port 21 is formed in a top plate of the chamber 20. Discharge ports 22 are formed in a bottom portion of the chamber 20. Gas G containing a source gas for forming a film on the wafer W is supplied to the inside of the chamber 20 through the supply port 21. A window portion 23 is formed in the top plate of the chamber 20. The window portion 23 is a part through which infrared rays can be transmitted. The window portion 23 is positioned on the outward side from the supply port 21 in the radial direction about the rotation axis R, that is, at a position away from the rotation axis R in the radial direction from the supply port 21.

The supply tube 24 has a tubular shape extending in the vertical direction Z. The supply tube 24 opens both upward and downward. The gas G supplied to the inside of the chamber 20 through the supply port 21 flows downward inside the supply tube 24. The gas G flowing downward inside the supply tube 24 is supplied to the wafer W mounted on the susceptor 30. The excess gas G of the gas G supplied to the inside of the chamber 20 is discharged to the outside of the chamber 20 through the discharge ports 22.

When the source gas contained in the gas G reacts on the surface of the wafer W, an epitaxial film is formed on the surface of the wafer W. For example, the source gas is a gas containing Si-based gas and C-based gas. For example, the Si-based gas is silane ($SiH_4$), dichlorosilane ($SiH_2Cl_2$), trichlorosilane ($SiHCl_3$), tetrachlorosilane ($SiCl_4$), or the like. For example, the C-based gas is propane ($C_3H_8$) or the like. In the first embodiment, for example, the source gas is a gas containing silane ($SiH_4$) and propane ($C_3H_8$).

In the first embodiment, gases to be used other than the source gas are also supplied to the inside of the chamber 20 through the supply port 21. Examples of the gases to be used include an impurity gas, a carrier gas, and hydrogen chloride (HCl) gas. Examples of the impurity gas include an N-type impurity gas such as nitrogen, and a P-type impurity gas such as trimethylaluminum (TMA). For example, the carrier gas is argon gas or hydrogen gas. More specifically, the carrier gas used when the wafer W is carried into the vapor phase growth apparatus 10 and mounted on the susceptor 30 and when the wafer W after film formation is taken out from the susceptor 30 and carried out to the outside of the vapor phase growth apparatus 10 is argon gas. The carrier gas at the time of film formation is hydrogen gas.

The susceptor 30 is a support member supporting the wafer W from below. The susceptor 30 is supported by the drive unit 60 from below. As shown in FIG. 2, the susceptor 30 has a susceptor main body 31 and a movable portion 32. The susceptor main body 31 supports the wafer W from below. In the first embodiment, the susceptor main body 31 has a ring shape surrounding the rotation axis R. The susceptor main body 31 has an inward ring-shaped portion 33, a wafer support portion 34, and a guide support portion 35. As shown in FIG. 3, the inward ring-shaped portion 33 has a ring shape surrounding the rotation axis R. In the first embodiment, a radially inner edge portion of the inward ring-shaped portion 33 is a radially inner edge portion of the susceptor main body 31.

The wafer support portion 34 is positioned on the radially outward side from the inward ring-shaped portion 33. The wafer support portion 34 is a part supporting the wafer W from below. The wafer support portion 34 has a ring shape surrounding the rotation axis R. A radially inner edge portion of the wafer support portion 34 is connected to a radially outer edge portion of the inward ring-shaped portion 33. In the first embodiment, the wafer support portion 34 has an arc portion *34a* and a straight portion *34b*. The arc portion *34a* is a part of the wafer support portion 34 extending in an arc shape about the rotation axis R when viewed in the vertical direction Z. For example, the central angle of the arc portion *34a* is approximately 320[°]. The central angle of the arc portion *34a* is not particularly limited. The straight portion *34b* is a part of the wafer support portion 34 extending linearly when viewed in the vertical direction Z. The straight portion *34b* connects one end and the other end of the arc portion *34a*. The straight portion *34b* supports a part, of the part positioned on the radially inward side of a radially outer edge portion of the wafer W, positioned on the radially inward side of the orientation flat portion Wd from below. The arc portion *34a* supports a part, of the part positioned on the radially inward side of the radially outer edge portion of the wafer W, excluding the part positioned on the radially inward side of the orientation flat portion Wd from below.

The wafer support portion 34 has a plurality of first recessed portions *34c* recessed downward from the upward surface of the wafer support portion 34. The plurality of first recessed portions *34c* are disposed with an interval therebetween in the circumferential direction around the rotation axis R when viewed in the vertical direction Z. The plurality of first recessed portions *34c* extend radially in the radial direction. In the first embodiment, the plurality of first recessed portions *34c* penetrate the wafer support portion 34 in the radial direction. The upward surface of the wafer support portion 34 are divided by the plurality of first recessed portions *34c* in a direction in which the wafer support portion 34 extends when viewed in the vertical direction Z. As shown in FIG. 2, in the first embodiment, bottom surfaces of the first recessed portions *34c* are positioned above the upward surface of the guide support portion 35, that is, a guide contact surface *35s*, which will be described below.

The wafer support portion 34 has wafer contact surfaces *34s* which come into contact with the wafer W. The wafer contact surfaces *34s* are upward facing surfaces. The wafer contact surfaces *34s* are upward surfaces of the wafer support portion 34. The wafer contact surfaces *34s* are positioned above the upward surface of the inward ring-shaped portion 33. As shown in FIG. 3, in the first embodiment, a plurality of wafer contact surfaces *34s* are disposed with an interval therebetween in the circumferential direction around the rotation axis R when viewed in the vertical direction Z. The plurality of wafer contact surfaces 34*s* are respective parts on the upward surface of the wafer support portion 34 divided into a plurality of parts by the plurality of first recessed portions 34*c*. In the first embodiment, each of the wafer contact surfaces 34*s* is a flat surface orthogonal to the vertical direction Z. In the first embodiment, the dimension of each of the wafer contact surfaces 34*s* in the circumferential direction decreases toward the radially inward side. When the plurality of first recessed portions 34*c* are not formed, the wafer support portion 34 may have one ring-shaped wafer contact surface 34*s* surrounding the rotation axis R.

The guide support portion 35 is positioned on the outward side in the radial direction from the wafer support portion 34. In the first embodiment, the guide support portion 35 has a ring shape surrounding the rotation axis R. More specifically, the guide support portion 35 has substantially a toric shape about the rotation axis R. The guide support portion 35 is a part supporting the wafer guide 40 from below. As shown in FIG. 2, in the first embodiment, a radially inner edge portion of the guide support portion 35 is connected to a radially outer edge portion of the wafer support portion 34. The guide support portion 35 has the guide contact surface 35*s* which comes into contact with the wafer guide 40. The guide contact surface 35*s* is part, on the upward surface of the wafer support portion 34, which comes into contact with the wafer guide 40. In the first embodiment, the guide contact surface 35*s* is a flat surface orthogonal to the vertical direction Z. The guide contact surface 35*s* is positioned below each of the wafer contact surfaces 34*s*. In other words, each of the wafer contact surfaces 34*s* is positioned above the guide contact surface 35*s*. The guide contact surface 35*s* is positioned above the upward surface of the inward ring-shaped portion 33. As shown in FIG. 3, in the first embodiment, the guide contact surface 35*s* has a ring shape surrounding the rotation axis R. More specifically, the guide contact surface 35*s* has substantially a toric shape about the rotation axis R.

The movable portion 32 is a body separated from the susceptor main body 31. The movable portion 32 is disposed on the radially inward side of the inward ring-shaped portion 33 of the susceptor main body 31. The movable portion 32 is fitted into the radially inward side of the inward ring-shaped portion 33 of the susceptor main body 31. In the first embodiment, an inward portion 36 positioned on the inward side in the radial direction from the wafer support portion 34 is formed by the movable portion 32 and the inward ring-shaped portion 33. An upper surface 36*s* of the inward portion 36 is formed by the upward surface of the movable portion 32 and the upward surface of the inward ring-shaped portion 33. The upper surface 36*s* of the inward portion 36 is positioned below the wafer contact surfaces 34*s*. The upper surface 36*s* of the inward portion 36 is positioned below the guide contact surface 35*s*. In a state where the wafer W is mounted on the susceptor 30, the rear surface Wb of the wafer W is disposed above away from the upper surface 36*s* of the inward portion 36. A gap is provided between the wafer W and the upper surface 36*s* of the inward portion 36 in the vertical direction Z.

Figure 4:
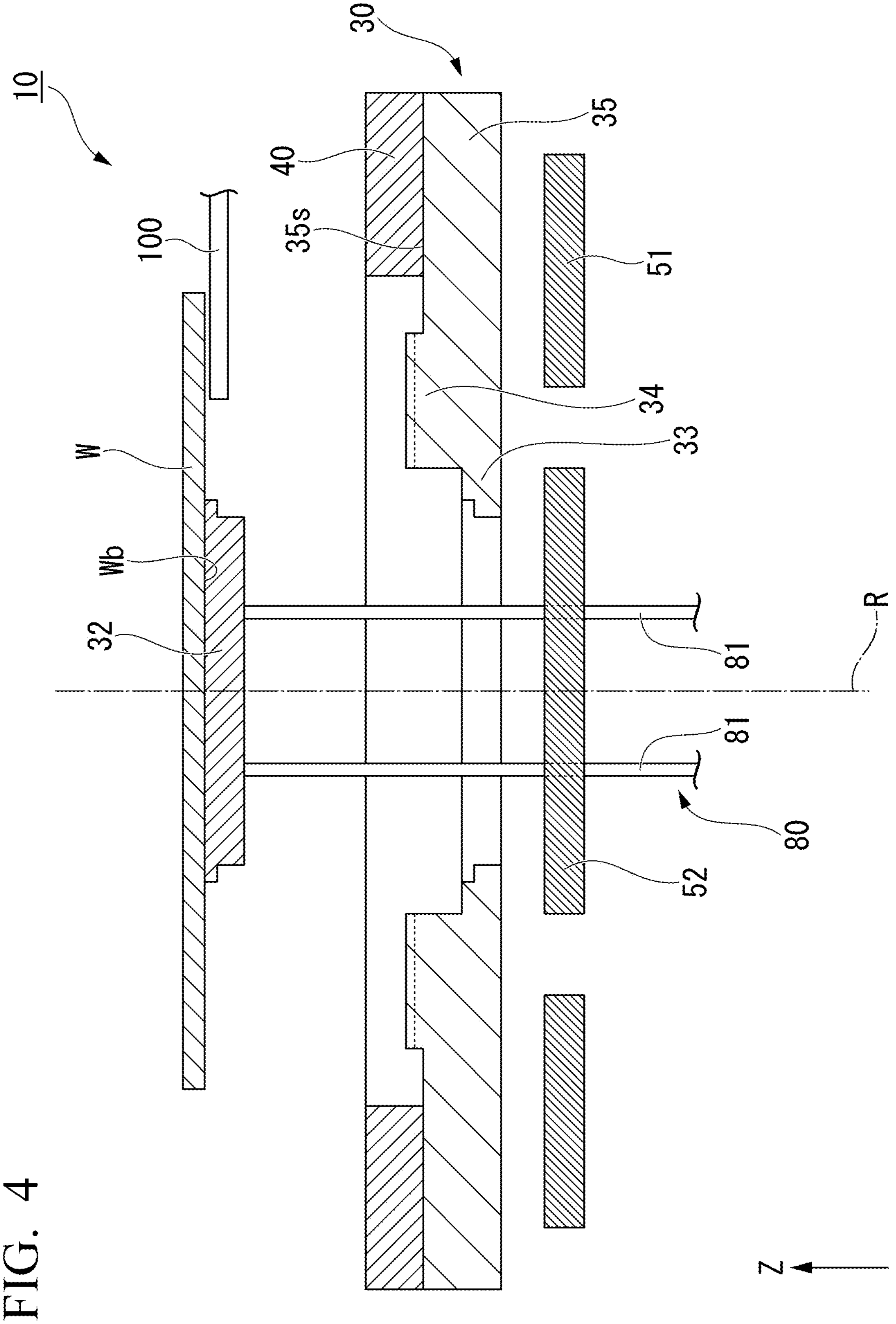
FIG. 4 is a cross-sectional view showing a part of the vapor phase growth apparatus of the first embodiment when a wafer is transported.

The movable portion 32 can move in the vertical direction Z. FIG. 4 is a cross-sectional view showing a part of the vapor phase growth apparatus 10 when the wafer W is transported. As shown in FIG. 4, when the wafer W is transported, the movable portion 32 is moved upward beyond the inward ring-shaped portion 33. In the first embodiment, the movable portion 32 is moved in the vertical direction Z by an elevation portion 80. The elevation portion 80 has a plurality of movable pins 81 positioned below the movable portion 32. The elevation portion 80 moves the movable portion 32 upward by moving the plurality of movable pins 81 upward such that the plurality of movable pins 81 push up the movable portion 32 upward from below. The plurality of movable pins 81 move upward beyond the second heating portion 52 through the gap provided in the second heating portion 52 and push up the movable portion 32 upward.

When the wafer W is transported onto the susceptor 30, the wafer W transported by a transportation portion 100 is mounted on the movable portion 32 positioned above the inward ring-shaped portion 33. If the movable portion 32 is moved downward by the elevation portion 80 in this state, a part of the wafer W on the radially outward side is supported by the wafer support portion 34 from below, and the wafer W is mounted on the susceptor 30. When the wafer W on the susceptor 30 is transported therefrom, the movable portion 32 moves upward, and the wafer W is lifted upward beyond the wafer support portion 34 and the wafer guide 40 by the movable portion 32. In this state, the wafer W on the movable portion 32 is transported therefrom by the transportation portion 100.

The wafer guide 40 is supported by the susceptor 30 from below. The wafer guide 40 has a ring shape surrounding the rotation axis R. More specifically, as shown in FIG. 3, the wafer guide 40 has a toric shape about the rotation axis R. The wafer guide 40 surrounds the outer edge of the wafer W. For example, the wafer guide 40 has a plate shape in which the plate surface is directed in the vertical direction Z. For example, the wafer guide 40 is made of poly-SiC. The wafer guide 40 may be made of graphite. In this case, a coating layer constituted by SiC may be provided on the surface of the wafer guide 40.

As shown in FIG. 2, the wafer guide 40 is supported by the guide support portion 35 from below. The lower surface of the wafer guide 40 comes into contact with the guide contact surface 35*s*. In the first embodiment, the radially inner edge of the wafer guide 40 is positioned on the radially outward side from the radially inner edge on the upper surface of the guide support portion 35. The lower surface of the wafer guide 40 is positioned below the wafer contact surfaces 34*s*. The upper surface of the wafer guide 40 is positioned above the upper surface, that is, the surface Wa of the wafer W mounted on the wafer support portion 34. The upper end portion on the radially inward surface of the wafer guide 40 is positioned above the wafer contact surfaces 34*s*. Namely, the wafer contact surfaces 34*s* are positioned below the end portion on the inner circumferential surface of the wafer guide 40 on the upward side.

A recessed portion recessed in the vertical direction Z may be formed in one of the wafer guide 40 and the guide support portion 35, and a projection portion protruding in the vertical direction Z and fitted into the recessed portion may be formed in the other of the wafer guide 40 and the guide support portion 35. With this constitution, a situation in which the wafer guide 40 is offset in the radial direction with respect to the guide support portion 35 is curbed.

As shown in FIG. 1, the drive unit 60 rotates the susceptor 30 around the rotation axis R extending in the vertical direction Z. The drive unit 60 has a susceptor holding portion 61 and a power unit 62. The susceptor holding portion 61 has a tubular shape opening upward. The susceptor 30 is held by the end portion of the susceptor holding portion 61 on the upward side. The susceptor holding portion 61 is positioned inside the chamber 20. The end portion of the susceptor holding portion 61 on the downward side is positioned outside the chamber 20 through the hole formed in the bottom portion of the chamber 20. The power unit 62 rotates the susceptor holding portion 61 around the rotation axis R. For example, the power unit 62 is a motor. The power unit 62 is connected to the end portion of the susceptor holding portion 61 on the downward side. The power unit 62 may have a motor and a deceleration mechanism connected to the motor. In this case, rotation of the motor is transmitted to the susceptor holding portion 61 via the deceleration mechanism. For example, the power unit 62 is positioned outside the chamber 20.

The first heating portions 51 and the second heating portion 52 can heat the susceptor 30. When the susceptor 30 is heated by the first heating portions 51 and the second heating portion 52, the wafer W and the wafer guide 40 which come into contact with the susceptor 30 are heated. As shown in FIG. 2, in the first embodiment, the first heating portions 51 and the second heating portion 52 are positioned below the susceptor 30. The first heating portions 51 and the second heating portion 52 heat the susceptor 30 by applying heat H to the susceptor 30 from below. The first heating portions 51 and the second heating portion 52 are positioned inside the susceptor holding portion 61 in the drive unit 60. The first heating portions 51 and the second heating portion 52 are resistance heating-type heaters. For example, the first heating portions 51 and the second heating portion 52 are constituted of heating wires extending along a plane orthogonal to the vertical direction Z. The first heating portions 51 and the second heating portion 52 may have any structure as long as they are capable of heating a target.

The first heating portions 51 are positioned on the outward side in the radial direction from the second heating portion 52. The first heating portions 51 surround the second heating portion 52 from the radially outward side. The first heating portions 51 are positioned below the wafer support portion 34 and the guide support portion 35. At least a part of each of the first heating portions 51 overlaps the wafer support portion 34 when viewed in the vertical direction Z. In the first embodiment, a radially inner edge portions of the first heating portions 51 overlap a radially outward part of the wafer support portion 34 when viewed in the vertical direction Z. A part of the first heating portions 51 positioned on the radially outward side from the wafer support portion 34 overlaps the guide support portion 35 when viewed in the vertical direction Z. A part of the first heating portions 51 on the radially outward side overlaps the wafer guide 40 when viewed in the vertical direction Z.

The second heating portion 52 is positioned on the radially inward side away from the first heating portions 51. The second heating portion 52 is positioned below the inward portion 36. At least a part of the second heating portion 52 overlaps the inward portion 36 when viewed in the vertical direction Z. In the first embodiment, almost the entire second heating portion 52 overlaps the inward portion 36 when viewed in the vertical direction Z. A radially outer edge portion of the second heating portion 52 is positioned below the inward ring-shaped portion 33. A part of the second heating portion 52 excluding the radially outer edge portion is positioned below the movable portion 32.

As shown in FIG. 1, the third heating portions 53 have a ring shape surrounding the supply tube 24. In the first embodiment, the vapor phase growth apparatus 10 includes three third heating portions 53. The three third heating portions 53 are disposed with an interval therebetween in the vertical direction Z. Each of the third heating portions 53 heats the gas G passing through the inside of the supply tube 24. Accordingly, the temperature of the gas G when it arrives at the wafer W can be increased. Therefore, the film formation speed of the SiC film formed on the surface of the wafer W can be increased. The number of third heating portions 53 provided in the vapor phase growth apparatus 10 may be two or smaller or may be four or larger. For example, the third heating portions 53 are resistance heating-type heaters constituted of heating wires. The third heating portions 53 may have any structure as long as they are capable of heating a target.

The first temperature sensor 71 and the second temperature sensor 72 are temperature sensors capable of measuring the temperature of the wafer W. In the first embodiment, the first temperature sensor 71 and the second temperature sensor 72 are radiation thermometers. The first temperature sensor 71 and the second temperature sensor 72 are positioned outside the chamber 20. The first temperature sensor 71 and the second temperature sensor 72 are positioned above the window portion 23. The first temperature sensor 71 and the second temperature sensor 72 measure the temperature of the wafer W by receiving infrared rays radiated from the wafer W via the window portion 23. For example, the positions of the first temperature sensor 71 and the second temperature sensor 72 in the radial direction can be adjusted.

As shown in FIG. 2, the first temperature sensor 71 can measure the temperature of a part in the wafer W overlapping the wafer support portion 34 when viewed in the vertical direction Z. The second temperature sensor 72 can measure the temperature of a part in the wafer W overlapping the inward portion 36 when viewed in the vertical direction Z. In the first embodiment, the second temperature sensor 72 can measure the temperature of a part in the wafer W positioned on the inward side in the radial direction from the outer edge of the movable portion 32 in the radial direction, and on the outward side in the radial direction from the rotation axis R. The second temperature sensor 72 can measure the temperature of a part in the wafer W positioned on the radially inward side from the center in the radial direction between the radially inner edge of the wafer support portion 34 and the rotation axis R.

In this specification, regarding the expression "a temperature sensor can measure the temperature of a certain part in a wafer", the temperature sensor need only be able to be disposed at a position where the temperature of a certain part in the wafer can be measured. In the first embodiment, the first temperature sensor 71 is provided such that it can move to a position where the temperature of a part in the wafer W overlapping the wafer support portion 34 can be measured when viewed in the vertical direction Z. The second temperature sensor 72 is provided such that it can move to a position where the temperature of a part in the wafer W overlapping the inward portion 36 can be measured when viewed in the vertical direction Z.

Figure 5:
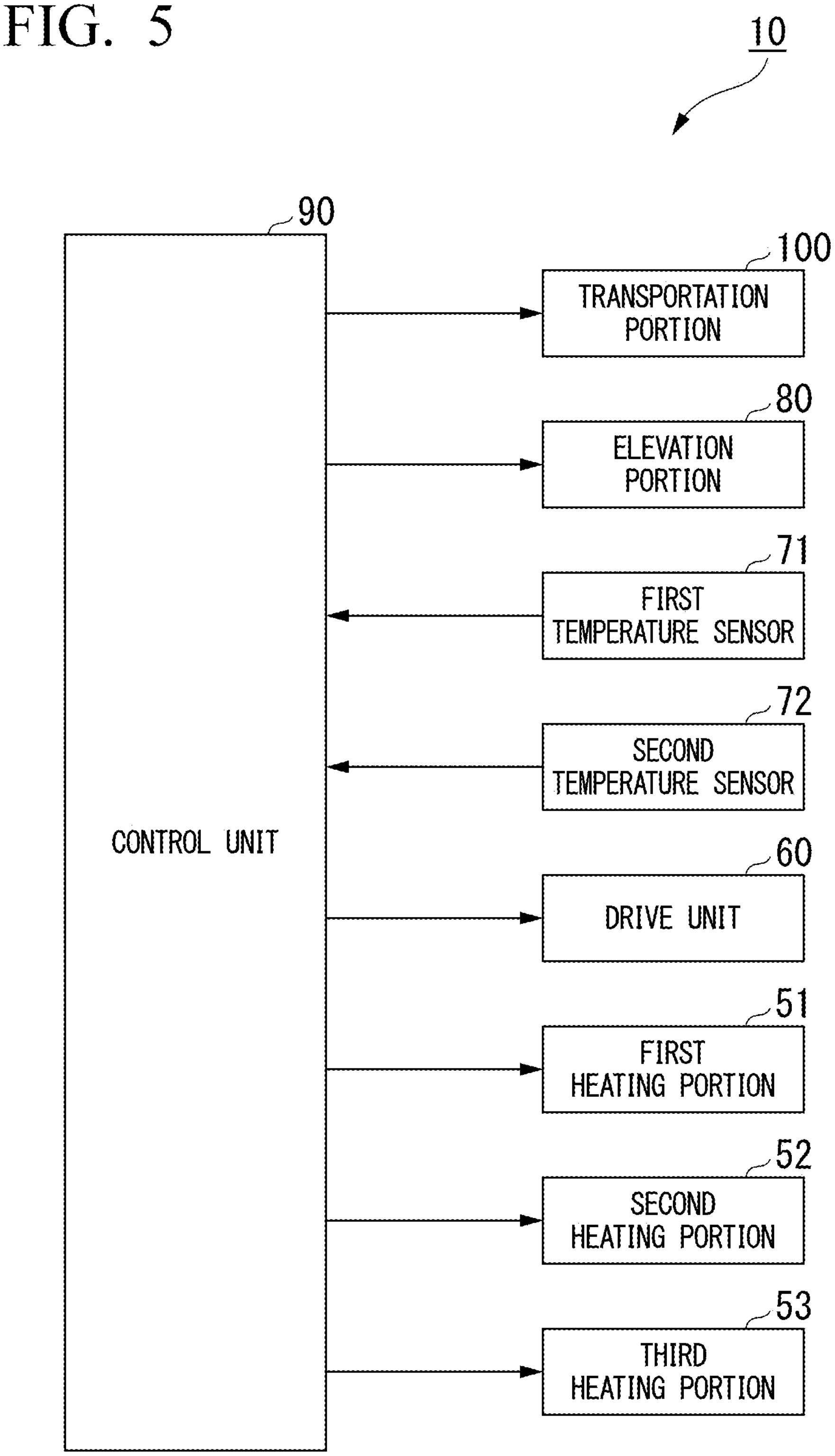
FIG. 5 is a block diagram showing a part of the vapor phase growth apparatus of the first embodiment.

FIG. 5 is a block diagram showing a part of the vapor phase growth apparatus 10. As shown in FIG. 5, the vapor phase growth apparatus 10 includes a control unit 90. The control unit 90 controls each portion of the vapor phase growth apparatus 10. The control unit 90 controls the first heating portions 51, the second heating portion 52, the third heating portions 53, the drive unit 60, the elevation portion 80, and the transportation portion 100.

Figure 6:
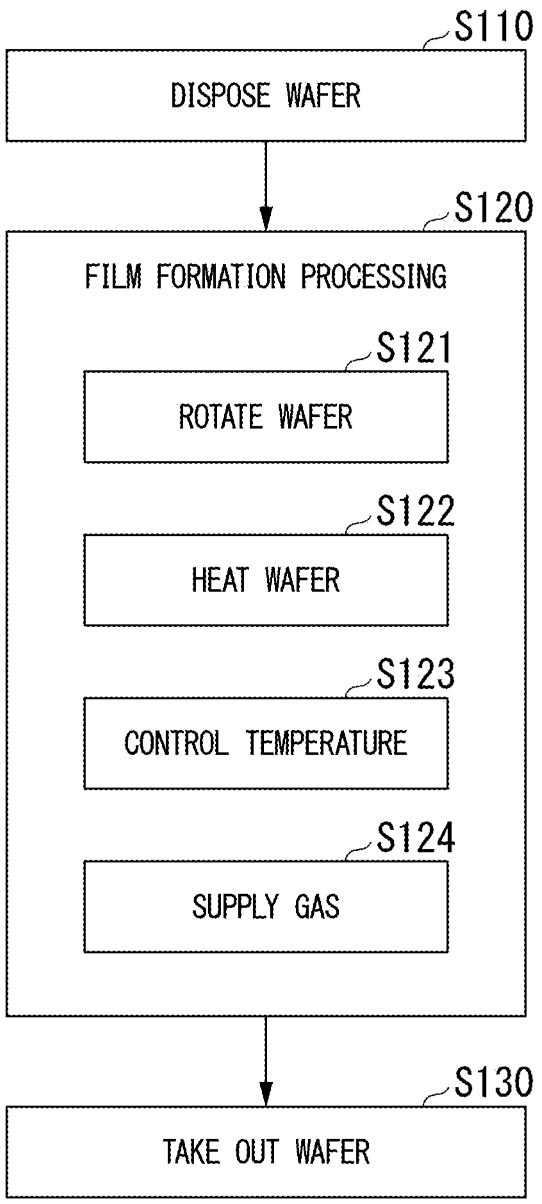
FIG. 6 is a flowchart showing an example of a procedure of a film formation method of forming a film on a surface of a wafer by the vapor phase growth apparatus of the first embodiment.

FIG. 6 is a flowchart showing an example of a procedure of a film formation method for forming a film on a surface of the wafer W by the vapor phase growth apparatus 10. As shown in FIG. 6, the control unit 90 causes the wafer W to be disposed on the susceptor 30 (Step S110). In Step S110, the control unit 90 causes the transportation portion 100 to transport the wafer W such that the wafer W is mounted on the movable portion 32 in a state of having moved upward as shown in FIG. 4. The control unit 90 controls the elevation portion 80 to move the movable portion 32 downward such that the wafer W on the movable portion 32 is mounted on the wafer support portion 34. Accordingly, the wafer W is mounted on the susceptor 30.

After the wafer W is mounted on the susceptor 30, the control unit 90 executes the film formation processing of forming a film on the surface of the wafer W (Step S120). Namely, the film formation method according to the first embodiment includes the film formation processing of forming a film on the surface of the wafer W. During the film formation processing, the control unit 90 causes the wafer W to rotate around the rotation axis R (Step S121) and causes the wafer W to be heated (Step S122). During the film formation processing, the control unit 90 causes the wafer W to be rotated around the rotation axis R by causing the drive unit 60 to rotate the susceptor 30 around the rotation axis R. During the film formation processing, the control unit 90 causes the wafer W to be heated by causing the first heating portions 51 and the second heating portion 52 to heat the susceptor 30. Rotating the wafer W and heating the wafer W are performed until the film formation processing ends.

During the film formation processing, the control unit 90 controls the temperature of the wafer W (Step S123). In Step S123, as shown in FIG. 2, the control unit 90 measures the temperature of a part in the wafer W overlapping the wafer support portion 34 when viewed in the vertical direction Z by the first temperature sensor 71. In Step S123, the control unit 90 measures the temperature of a part in the wafer W overlapping the inward portion 36 when viewed in the vertical direction Z by the second temperature sensor 72. In the first embodiment, in Step S123, the control unit 90 measures the temperature of a part in the wafer W positioned on the inward side in the radial direction from the outer edge of the movable portion 32 in the radial direction, and on the outward side in the radial direction from the rotation axis R by the second temperature sensor 72. In Step S123, the control unit 90 measures the temperature of a part in the wafer W positioned on the radially inward side from the center in the radial direction between the radially inner edge of the wafer support portion 34 and the rotation axis R by the second temperature sensor 72.

In Step S123, the control unit 90 controls the first heating portions 51 and the second heating portion 52 on the basis of measurement results of the first temperature sensor 71 and measurement results of the second temperature sensor 72. Namely, the film formation processing in the film formation method of the first embodiment includes controlling the first heating portions 51 and the second heating portion 52 on the basis of measurement results of the first temperature sensor 71 and measurement results of the second temperature sensor 72.

In the first embodiment, in Step S123, the control unit 90 controls the first heating portions 51 and the second heating portion 52 such that the difference between the temperature measured by the first temperature sensor 71 and the temperature measured by the second temperature sensor 72 becomes equal to or smaller than a predetermined value. Namely, the film formation processing in the film formation method of the first embodiment includes controlling the first heating portions 51 and the second heating portion 52 such that the difference between the temperature measured by the first temperature sensor 71 and the temperature measured by the second temperature sensor 72 becomes equal to or smaller than a predetermined value. For example, the predetermined value is 10° C. The predetermined value may be lower than 10° C. or may be higher than 10° C. The control unit 90 controls the first heating portions 51 and the second heating portion 52 such that the temperature of the wafer W measured by the first temperature sensor 71 and the temperature of the wafer W measured by the second temperature sensor 72 become 1,500° C. to 1,650° C., for example. A first target temperature set as a target value for the temperature of the wafer W measured by the first temperature sensor 71 and a second target temperature set as a target value for the temperature of the wafer W measured by the second temperature sensor 72 are set within temperature range of 1,500° C. to 1,650° C., for example. The first target temperature is 1,600° C., for example. The second target temperature is 1,610° C., for example.

During the film formation processing, the control unit 90 causes the gas G containing the source gas to flow into the chamber 20 through the supply port 21, thereby supplying the gas G to the wafer W (Step S124). During the film formation processing, the control unit 90 performs gas flowing amount control of controlling the flowing amount of the gas G and pressure control of controlling the pressure inside the chamber 20. The SiC film is formed on the surface Wa of the wafer W by supplying the source gas to the heated surface Wa of the wafer W. The SiC film having a desired thickness is formed on the surface Wa of the wafer W by continuously supplying the source gas to the wafer W for a predetermined time. The supply amount of the source gas and variation in the source gas within the surface Wa of the wafer W can be reduced by supplying the source gas to the surface Wa of the wafer W while the wafer W is rotated around the rotation axis R by the drive unit 60. Therefore, the uniformity of the thickness of the film formed on the wafer W can be enhanced. During the film formation processing, the control unit 90 causes the third heating portions 53 to heat the gas G inside the supply tube 24. If the film formation processing ends, the control unit 90 stops the drive unit 60 and each of the heating portions and stops supply of the gas G to the inside of the chamber 20.

Step S123 described above, in which the temperature of the wafer W is controlled, is continuously executed at all times during the film formation processing, for example. Step S123 may be performed at predetermined time intervals. Step S121, in which the wafer W is rotated, may be started before the gas G is supplied after the wafer W is heated to a predetermined temperature.

After the film formation processing ends, the control unit 90 causes the wafer W to be taken out from the vapor phase growth apparatus 10 (Step S130). In Step S130, the control unit 90 causes the elevation portion 80 to move the movable portion 32 upward such that the wafer W is lifted up. The control unit 90 causes the transportation portion 100 to transport the lifted wafer W.

In vapor phase growth apparatus in the related art, there are cases where the wafer W is offset during the film formation processing so that the outer edge of the wafer W enters a gap between the wafer guide and the susceptor. In this case, since no film is formed in a part at the outer edge of the wafer W which has entered the gap between the wafer guide and the susceptor, there is a problem that film formation accuracy of the film formed on the wafer W is degraded, such as occurrence of variation in the thickness of the film formed on the wafer W. In addition, there is also a problem that the wafer W is caught by the wafer guide when the wafer W is transported, causing trouble in transportation of the wafer W. The film formation accuracy of the film formed on the wafer W includes uniformity of the thickness of the film formed on the wafer W, uniformity of the carrier concentration of the film formed on the wafer W, and the like.

Regarding the foregoing problems, according to the first embodiment, the vapor phase growth apparatus 10 is a vapor phase growth apparatus for forming a film on a surface of the wafer W. The vapor phase growth apparatus 10 includes the susceptor 30 supporting the wafer W from below, the drive unit 60 rotating the susceptor 30 around the rotation axis R extending in the vertical direction Z, the ring-shaped wafer guide 40 supported by the susceptor 30 from below and surrounding the outer edge of the wafer W, the first temperature sensor 71 and the second temperature sensor 72 capable of measuring the temperature of the wafer W, the first heating portions 51 and the second heating portion 52 capable of heating the susceptor 30, and the control unit 90 controlling the first heating portions 51 and the second heating portion 52. The susceptor 30 has the wafer support portion 34 supporting the wafer W from below, the guide support portion 35 positioned on the outward side from the wafer support portion 34 in the radial direction about the rotation axis R and supporting the wafer guide 40 from below, and the inward portion 36 positioned on the inward side in the radial direction from the wafer support portion 34. The wafer support portion 34 has the wafer contact surfaces 34*s* coming into contact with the wafer W. The upper surface 36*s* of the inward portion 36 is positioned below the wafer contact surfaces 34*s*. The guide support portion 35 has the guide contact surface 35*s* coming into contact with the wafer guide 40. The wafer contact surfaces 34*s* are positioned above the guide contact surface 35*s*. For this reason, in a state of being supported by the susceptor 30 from below, the rear surface Wb of the wafer W is disposed on the upward side from the guide contact surface 35*s* and the lower surface of the wafer guide 40. For this reason, even if the wafer W moves to the radially outward side during the film formation processing, entry of the wafer W between the susceptor 30 and the wafer guide 40 can be curbed. Accordingly, a situation in which no film is formed at the outer edge of the wafer W can be curbed. Therefore, degradation of the film formation accuracy of the film formed on the surface of the wafer W can be curbed. In addition, a situation in which the outer edge of the wafer Wis caught by the wafer guide 40 when the wafer W is transported can be curbed. For this reason, occurrence of trouble in transportation of the wafer W can be curbed.

Since the wafer contact surfaces 34*s* are positioned above the guide contact surface 35*s*, unless the position of the upper surface 36*s* in the vertical direction Z changes, compared to when the wafer contact surfaces 34*s* and the guide contact surface 35*s* are disposed at the same position in the vertical direction Z, the distance between the wafer contact surfaces 34*s* and the upper surface 36*s* of the inward portion 36 in the vertical direction Z increases. For this reason, the distance between the wafer W and the upper surface 36*s* of the inward portion 36 increases so that heat is unlikely to be transferred from the susceptor 30 to a part in the wafer W positioned above the inward portion 36. Meanwhile, since the part in the wafer W which comes into contact with the wafer contact surfaces 34*s* comes into contact with the susceptor 30, heat is likely to be transferred from the susceptor 30. Therefore, the difference between the temperature in the part in the wafer W on the radially inward side and the temperature in the part in the wafer W on the radially outward side is likely to increase. If the temperature difference within the surface of the wafer W increases, there is concern that variation in the thickness of the film formed on the surface of the wafer W and variation in the carrier concentration of the film may increase. In addition, when etching processing is performed on the surface Wa of the wafer W before the film formation processing is performed, if the temperature difference within the surface of the wafer W increases, there is concern that variation in etching amount in the etching processing may increase. In this case, there is concern that the thickness of the film formed on the surface Wa of the wafer W may further vary. Therefore, even if entry of the wafer W between the wafer guide 40 and the susceptor 30 can be curbed, there is concern that the film formation accuracy of the film formed on the wafer may be degraded. In addition, there is also concern that crystal defects, that is, dislocation may occur in the wafer W if the temperature difference within the surface of the wafer W increases.

Regarding the foregoing problems, according to the first embodiment, the first heating portions 51 are positioned on the outward side in the radial direction from the second heating portion 52. During the film formation processing of forming a film on a surface of the wafer W, the control unit 90 measures the temperature of a part in the wafer W overlapping the wafer support portion 34 when viewed in the vertical direction Z by the first temperature sensor 71, measures the temperature of a part in the wafer W overlapping the inward portion 36 when viewed in the vertical direction Z by the second temperature sensor 72, and controls the first heating portions 51 and the second heating portion 52 on the basis of measurement results of the first temperature sensor 71 and measurement results of the second temperature sensor 72. In other words, the film formation processing in the film formation method of forming a film on a surface of the wafer W by the vapor phase growth apparatus 10 includes measuring the temperature of a part in the wafer W overlapping the wafer support portion 34 when viewed in the vertical direction Z by the first temperature sensor 71, measuring the temperature of a part in the wafer W overlapping the inward portion 36 when viewed in the vertical direction Z by the second temperature sensor 72, and controlling the first heating portions 51 and the second heating portion 52 on the basis of measurement results of the first temperature sensor 71 and measurement results of the second temperature sensor 72. For this reason, the control unit 90 can measure the temperature of each of the parts in the wafer W in which the temperature is likely to rise, that is, the part overlapping the wafer support portion 34 in the vertical direction Z and the part in the wafer W in which the temperature is likely to drop, that is, the part overlapping the inward portion 36 in the vertical direction Z individually by the first temperature sensor 71 and the second temperature sensor 72. Accordingly, the control unit 90 can adjust outputs of the first heating portions 51 and an output of the second heating portion 52 such that the temperature difference within the surface of the wafer W does not increase. Specifically, for example, the control unit 90 controls outputs of the first heating portions 51 and the second heating portion 52 such that the temperature of the part in the wafer W overlapping the wafer support portion 34 in the vertical direction Z becomes 1,600° C. and the temperature of the part in the wafer W overlapping the inward portion 36 in the vertical direction Z becomes 1,610° C. Accordingly, the temperature of the part in the wafer W overlapping the inward portion 36 in the vertical direction Z can be easily raised, and an excessive increase in temperature of the part in the wafer W overlapping the wafer support portion 34 in the vertical direction Z can be curbed. Therefore, an increase in temperature difference within the surface of the wafer W can be curbed. For this reason, variation in the thickness of the film formed on the surface Wa of the wafer W and carrier concentration of the film can be curbed. Therefore, even if a structure in which the wafer contact surfaces 34*s* are positioned above the guide contact surface 35*s* is employed, degradation of the film formation accuracy of the film formed on the surface of the wafer W can be curbed. In addition, since an increase in temperature difference within the surface of the wafer W can be curbed, occurrence of crystal defects in the wafer W can be curbed.

As above, according to the first embodiment, while entry of the wafer W between the susceptor 30 and the wafer guide 40 is curbed, an increase in temperature difference within the surface of the wafer W can be curbed, and therefore degradation of the film formation accuracy of the film formed on the surface of the wafer W can be favorably curbed. In addition, occurrence of trouble in transportation of the wafer W and occurrence of crystal defects in the wafer W can also be curbed.

In addition, since the wafer contact surfaces 34*s* are positioned above the guide contact surface 35*s*, even if reaction products (deposits) accumulate in a part in the guide contact surface 35*s* positioned on the radially inward side from the radially inner edge of the wafer guide 40 during the film formation processing, a situation in which reaction products come into contact with the rear surface Wb of the wafer W supported by the wafer contact surfaces 34*s* can be curbed. Accordingly, adhesion of reaction products to the rear surface Wb of the wafer W can be curbed.

According to the first embodiment, during the film formation processing, the control unit 90 controls the first heating portions 51 and the second heating portion 52 such that the difference between the temperature measured by the first temperature sensor 71 and the temperature measured by the second temperature sensor 72 becomes equal to or smaller than a predetermined value. In other words, the film formation processing includes controlling the first heating portions 51 and the second heating portion 52 such that the difference between the temperature measured by the first temperature sensor 71 and the temperature measured by the second temperature sensor 72 becomes equal to or smaller than a predetermined value. For this reason, it is easy to make the temperature difference within the surface of the wafer W equal to or smaller than a predetermined value, and an increase in temperature difference within the surface of the wafer W can be more favorably curbed. Therefore, degradation of the film formation accuracy of the film formed on the surface of the wafer W can be further curbed.

According to the first embodiment, the wafer contact surfaces 34*s* are positioned below the end portion on the inner circumferential surface of the wafer guide 40 on the upward side. For this reason, a situation in which the rear surface Wb of the wafer W which comes into contact with the wafer contact surfaces 34*s* is positioned above the upper end portion on the inner circumferential surface of the wafer guide 40 can be curbed. Accordingly, even when the wafer W moves to the radially outward side during the film formation processing, a situation in which the wafer W rides on the upward side of the wafer guide 40 can be curbed, and a situation in which the wafer W on the wafer support portion 34 flies out to the radially outward side therefrom can be curbed.

According to the first embodiment, the upper surface 36*s* of the inward portion 36 is positioned below the guide contact surface 35*s*. For this reason, even when the wafer W bends downward, a situation in which the rear surface Wb of the wafer W comes into contact with the upper surface 36*s* of the inward portion 36 can be curbed, and a situation in which a part in the wafer W supported by the wafer support portion 34 floats upward can be curbed. In this case, although the distance between the wafer W and the upper surface 36*s* of the inward portion 36 is likely to increase and the temperature of the part in the wafer W positioned above the inward portion 36 is likely to drop, an in temperature difference within the surface of the wafer W can be curbed by controlling the temperature by the control unit 90 as described above. Namely, an effect of being able to curb an increase in temperature difference within the surface of the wafer W can be achieved more effectively with a constitution in which the upper surface 36*s* of the inward portion 36 is positioned below the guide contact surface 35*s*.

According to the first embodiment, the inward portion 36 has the movable portion 32 capable of moving in the vertical direction Z. During the film formation processing, the control unit 90 measures the temperature of a part in the wafer W positioned on the inward side in the radial direction from the outer edge of the movable portion 32 in the radial direction, and on the outward side in the radial direction from the rotation axis R by the second temperature sensor 72. In other words, the film formation processing includes measuring the temperature of a part in the wafer W positioned on the inward side in the radial direction from the outer edge of the movable portion 32 in the radial direction, and on the outward side in the radial direction from the rotation axis R by the second temperature sensor 72. For this reason, compared to when the temperature of a part in the wafer W positioned on the radially outward side from the movable portion 32 is measured by the second temperature sensor 72, the temperature of a part in the wafer W on the radially inward side further away from the wafer support portion 34 can be measured by the second temperature sensor 72. The temperature of the wafer W is more likely to drop as it goes away from the wafer support portion 34 to the radially inward side. For this reason, the control unit 90 measures the temperature of a part in the wafer W on the radially inward side further away from the wafer support portion 34 by the second temperature sensor 72 to control the first heating portions 51 and the second heating portion 52, and therefore an increase in temperature difference within the surface of the wafer W can be further curbed. In addition, since the temperature of a part in the wafer W positioned on the radially outward side from the rotation axis R can be measured by the second temperature sensor 72, the temperature can be measured throughout the circumference in the circumferential direction in the part of the wafer W on the radially inward side. Accordingly, compared to when the temperature only at the center of the wafer W where the rotation axis R passes through is measured by the second temperature sensor 72, it is easier to favorably measure the temperature of the wafer W, and therefore an increase in temperature difference within the surface of the wafer W can be more favorably curbed.

According to the first embodiment, at least a part of the first heating portions 51 overlaps the wafer support portion 34 when viewed in the vertical direction Z. For this reason, it is easier to adjust the temperature of the wafer support portion 34 by changing the outputs of the first heating portions 51. Accordingly, it can be even easier to adjust the temperature of a part in the wafer W supported by the wafer support portion 34.

According to the first embodiment, at least a part of the second heating portion 52 overlaps the inward portion 36 when viewed in the vertical direction Z. For this reason, it is easier to adjust the temperature of the inward portion 36 by changing the output of the second heating portion 52. Accordingly, it can be even easier to adjust the temperature of a part in the wafer W positioned above the inward portion 36.

According to the first embodiment, the wafer support portion 34 has the plurality of first recessed portions 34*c* recessed downward from the upward surface of the wafer support portion 34 and has a ring shape surrounding the rotation axis R. The plurality of first recessed portions 34*c* are disposed with an interval therebetween in the circumferential direction around the rotation axis R when viewed in the vertical direction Z. Since the wafer support portion 34 has a ring shape, it is easier for the wafer W to be supported more stably by the wafer support portion 34 from below. In addition, since the plurality of first recessed portions 34*c* are formed, areas where the wafer support portion 34 and the wafer W come into contact with each other can be reduced. Accordingly, it is possible that heat is unlikely to be transferred from the wafer support portion 34 to the wafer W, and an excessive increase in temperature of the part in the wafer W supported by the wafer support portion 34 can be further curbed. In addition, when the wafer W is mounted on the wafer support portion 34, it is easier for the gas in a space between the wafer W and the inward portion 36 to escape to the outside via the plurality of first recessed portions 34*c*. Accordingly, it can be easier to mount the wafer W on the ring-shaped wafer support portion 34, and a situation in which the position of the wafer W in the radial direction or the rotation direction is offset when the wafer W is mounted can be curbed.

Hereinafter, other embodiments different from the foregoing embodiment will be described. In description of each of the following embodiments, the same reference signs are suitably applied or the like to constitutions similar to the constitutions described above in the description of each of the embodiments, and description may be omitted. In addition, the same names are given to parts corresponding to respective portions of the constitutions described above in the description of each of the embodiments. Different reference signs may be applied to describe points different from the constitutions described above, and description for the points similar to the constitutions described above may be omitted. Regarding the constitutions whose description is omitted in each of the following embodiments, constitutions similar to the constitutions described above in each of the embodiments can be employed within a range with no contradiction.

Second Embodiment

Figure 7:
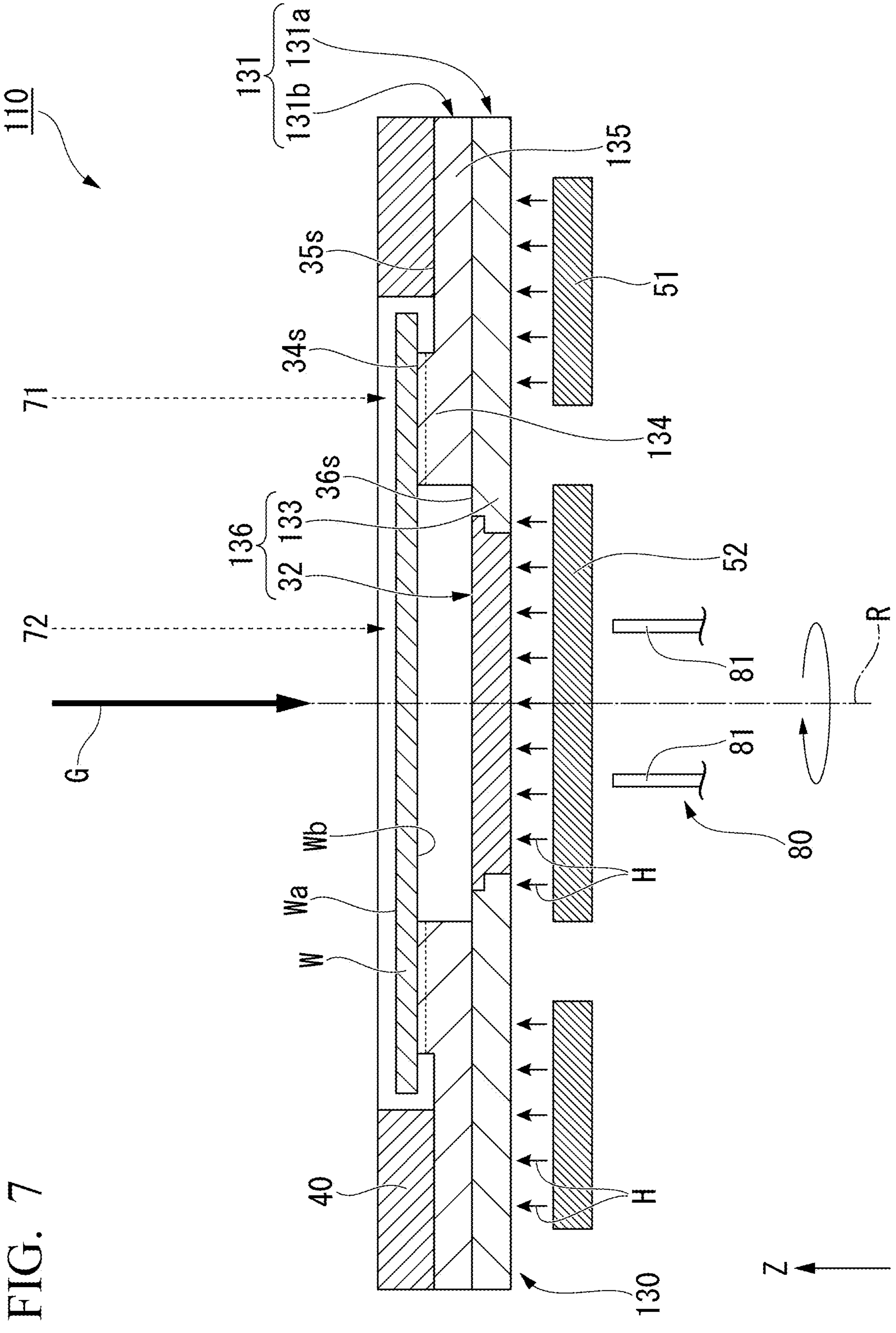
FIG. 7 is a cross-sectional view showing a part of a vapor phase growth apparatus of a second embodiment.

FIG. 7 is a cross-sectional view showing a part of a vapor phase growth apparatus 110 of a second embodiment. As shown in FIG. 7, in the second embodiment, a susceptor main body 131 is formed to have two members, such as a first member 131*a* and a second member 131*b*. The shape of the susceptor main body 131 formed to have two members, such as the first member 131*a* and the second member 131*b* is similar to the shape of the integrally molded susceptor main body 31 of the first embodiment.

The first member 131*a* and the second member 131*b* have a ring shape surrounding the rotation axis R. More specifically, the first member 131*a* and the second member 131*b* have substantially a toric shape about the rotation axis R. The second member 131*b* is positioned above the first member 131*a*. The lower surface of the second member 131*b* comes into contact with the upper surface of the first member 131*a*. The second member 131*b* is fixed to the first member 131*a*. The inner diameter of the second member 131*b* is larger than the inner diameter of the first member 131*a*. The radially inner edge of the first member 131*a* is positioned on the radially inward side from the radially inner edge of the second member 131*b*. A part of the first member 131*a* positioned on the radially inward side from the radially inner edge of the second member 131*b* is the inward ring-shaped portion 133. The second member 131*b* has a wafer support portion 134 having the wafer contact surfaces 34*s*, and a guide support portion 135 having the guide contact surface 35*s*. Other constitutions of the vapor phase growth apparatus 110 are similar to other constitutions of the vapor phase growth apparatus 10 according to the first embodiment.

Third Embodiment

Figure 8:
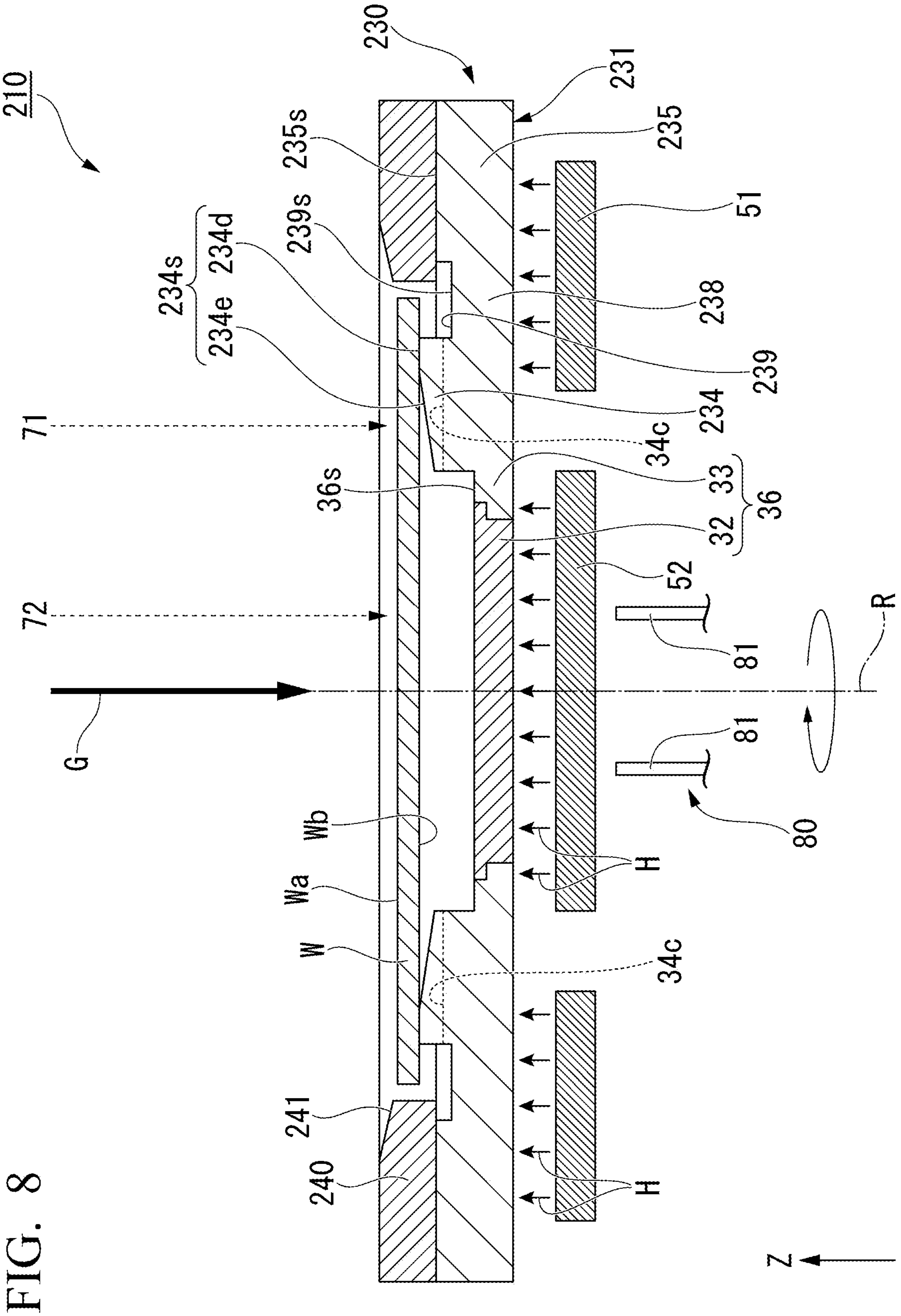
FIG. 8 is a cross-sectional view showing a part of a vapor phase growth apparatus of a third embodiment.

FIG. 8 is a cross-sectional view showing a part of a vapor phase growth apparatus 210 of a third embodiment. As shown in FIG. 8, in a susceptor main body 231 of the third embodiment, wafer contact surfaces 234*s* of a wafer support portion 234 each have a flat surface 234*d* and an inclined surface 234*e*. The flat surface 234*d* is a part of the wafer contact surface 234*s* on the radially outward side. The flat surface 234*d* is a flat surface orthogonal to the vertical direction Z. The inclined surface 234*e* is a part of the wafer contact surface 234*s* on the radially inward side. The inclined surface 234*e* is positioned downward toward the inward side in the radial direction. The end portion on the inclined surface 234*e* on the radially outward side is connected to the end portion on the flat surface 234*d* on the radially inward side. In a cross section orthogonal to the circumferential direction, the inclined surface 234*e* extends radially inward and obliquely downward from the end portion on the flat surface 234*d* on the radially inward side. The inclined surface 234*e* is connected to the inward surface of the wafer support portion 234 in the radial direction. More specifically, the end portion on the inclined surface 234*e* on the radially inward side is connected to the end portion on the radially inward surface of the wafer support portion 234 on the upward side. The dimension of the inclined surface 234*e* in the radial direction is larger than the dimension of the flat surface 234*d* in the radial direction. The dimension of the inclined surface 234*e* in the radial direction may be the same as the dimension of the flat surface 234*d* in the radial direction or may be smaller than the dimension of the flat surface 234*d* in the radial direction. Although illustration is omitted, similar to the first embodiment, a plurality of wafer contact surfaces 234*s* are provided with an interval therebetween in the circumferential direction.

Figure 9:
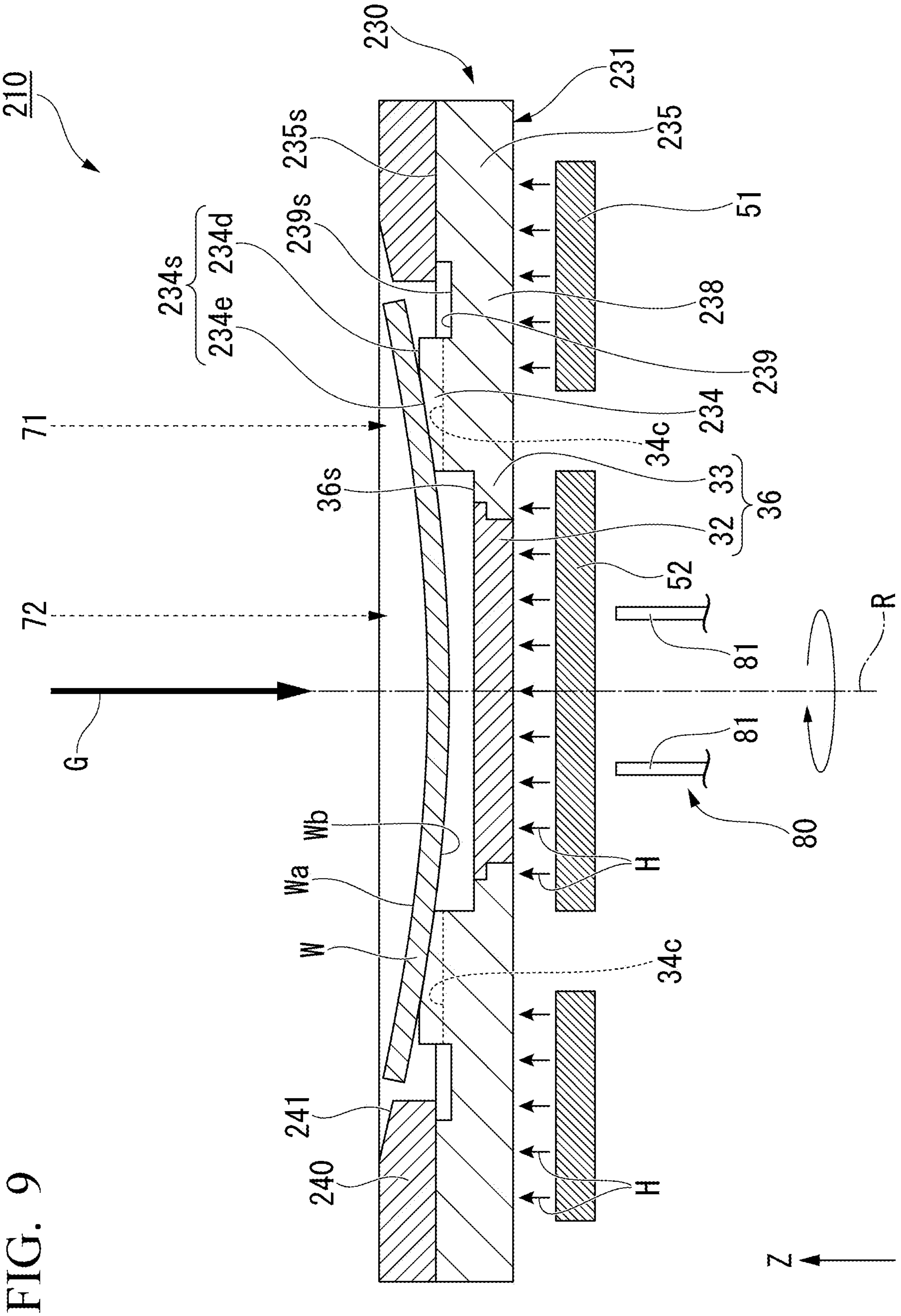
FIG. 9 is a cross-sectional view showing a state where the wafer is deformed during film formation processing by the vapor phase growth apparatus of the third embodiment.

FIG. 9 is a cross-sectional view showing a state where the wafer W is deformed during the film formation processing by the vapor phase growth apparatus 210 of the third embodiment. As shown in FIG. 9, during the film formation processing, the wafer W may bend due to the dead weight or the like, and the wafer W may curve in a shape projecting downward in a cross section along the rotation axis R. In this case, a part in the wafer W on the radially outward side supported by the wafer support portion 234 from below has a shape positioned upward toward the radially outward side. When the wafer W is deformed into a shape as in FIG. 9, a part on the rear surface Wb of the wafer W which comes into contact with the wafer support portion 234 comes into contact with the inclined surface 234*e*.

A susceptor 230 has a connection portion 238 positioned between the wafer support portion 234 and a guide support portion 235 in the radial direction. The connection portion 238 has a ring shape surrounding the rotation axis R. More specifically, the connection portion 238 has a toric shape about the rotation axis R. The connection portion 238 connects a radially outer edge portion of the wafer support portion 234 and a radially inner edge portion of the guide support portion 235. The upper surface of the connection portion 238 is positioned below the wafer contact surfaces 234*s* of the wafer support portion 234 and a guide contact surface 235*s* of the guide support portion 235. Accordingly, the susceptor 230 has a second recessed portion 239 recessed downward between the wafer support portion 234 and the guide support portion 235 in the radial direction. The second recessed portion 239 has a ring shape surrounding the rotation axis R. More specifically, the second recessed portion 239 has a toric shape about the rotation axis R. The bottom surface 239*s* of the second recessed portion 239 is positioned below the wafer contact surfaces 234*s* and the guide contact surface 235*s*. The bottom surface 239*s* of the second recessed portion 239 is positioned below the bottom surfaces of the first recessed portions 34*c*. The bottom surface 239*s* of the second recessed portion 239 is the upper surface of the connection portion 238.

The width of the wafer support portion 234 in the radial direction is larger than the width of the second recessed portion 239 in the radial direction. In other words, the distance in the radial direction between the inner end portion of the wafer support portion 234 in the radial direction and the outer end portion of the wafer support portion 234 in the radial direction is larger than the distance in the radial direction between the inner end portion of the second recessed portion 239 in the radial direction and the outer end portion of the second recessed portion 239 in the radial direction.

In the third embodiment, the radially inner edge of the guide support portion 235 is positioned on the radially outward side from the radially inner edge of a wafer guide 240. The radially inner edge on the guide contact surface 235*s* is positioned on the radially outward side from the radially inner edge of the wafer guide 240. Other constitutions of the susceptor 230 are similar to other constitutions of the susceptor 30 of the first embodiment. The susceptor 230 may be constituted of two members as in the second embodiment.

In the third embodiment, the upper surface of the wafer guide 240 has a wafer guide inclined surface 241. The wafer guide inclined surface 241 is a part on the upper surface of the wafer guide 240 on the radially inward side. The radially inner edge on the wafer guide inclined surface 241 is the radially inner edge on the upper surface of the wafer guide 240. The radially inner edge on the wafer guide inclined surface 241 is connected to the upper end portion of the wafer guide 240 on the radially inward surface. The wafer guide inclined surface 241 is positioned upward toward the radially outward side. The wafer guide inclined surface 241 has a ring shape surrounding the rotation axis R. More specifically, the wafer guide inclined surface 241 has a toric shape about the rotation axis R when viewed in the vertical direction Z. Since the wafer guide inclined surface 241 is provided, the gas G flowing to the radially outward side after being sprayed onto the surface Wa of the wafer W from above can be easily guided to the radially outward side by the wafer guide inclined surface 241. Accordingly, a flow of the gas G during the film formation processing can be regulated. The end portion of the wafer guide 240 on the radially inward side faces a part on the bottom surface 239*s* of the second recessed portion 239 on the radially outward side with a gap therebetween in the vertical direction Z. Other constitutions of the wafer guide 240 are similar to other constitutions of the wafer guide 40 of the first embodiment.

During the film formation processing of the third embodiment, the control unit 90 measures the temperature of a part in the wafer W overlapping the inclined surface 234*e* when viewed in the vertical direction Z by the first temperature sensor 71. Namely, the film formation processing in the film formation method of the third embodiment includes measuring the temperature of a part in the wafer W overlapping the inclined surface 234*e* when viewed in the vertical direction Z by the first temperature sensor 71. Other control of the control unit 90 is similar to other control according to the first embodiment. Other constitutions of the vapor phase growth apparatus 210 are similar to other constitutions of the vapor phase growth apparatus 10 according to the first embodiment.

According to the third embodiment, the wafer contact surfaces 234*s* each have the inclined surface 234*e* positioned downward toward the inward side in the radial direction. For this reason, when the wafer W is deformed as in FIG. 9, the rear surface Wb of the wafer W can be brought into contact with the inclined surface 234*e*. Accordingly, when the wafer W is deformed as in FIG. 9, it is easy to increase the contact area between the wafer W and the wafer support portion 234, and it is easy to stably support the wafer W by the wafer support portion 234 from below. In addition, according to the third embodiment, during the film formation processing, the control unit 90 measures the temperature of a part in the wafer W overlapping the inclined surface 234*e* when viewed in the vertical direction Z by the first temperature sensor 71. In other words, the film formation processing includes measuring the temperature of a part in the wafer W overlapping the inclined surface 234*e* when viewed in the vertical direction Z by the first temperature sensor 71. For this reason, when the wafer W is deformed as in FIG. 9 and the rear surface Wb of the wafer W comes into contact with the inclined surface 234*e*, the temperature of the contact part with respect to the inclined surface 234*e* where the temperature is most likely to rise in the wafer W can be measured by the first temperature sensor 71. Accordingly, an increase in temperature difference within the surface of the wafer W can be further curbed by controlling each of the heating portions on the basis of measurement results of the first temperature sensor 71. Therefore, degradation of the film formation accuracy of the film formed on the surface of the wafer W can be further curbed.

According to the third embodiment, the susceptor 230 has the second recessed portion 239 recessed downward between the wafer support portion 234 and the guide support portion 235 in the radial direction. The bottom surface 239*s* of the second recessed portion 239 is positioned below the guide contact surface 235*s*. For this reason, compared to when the second recessed portion 239 is not provided, a part on the upper surface of the susceptor 230 positioned on the radially outward side of the wafer support portion 234 can be disposed below at a position away from the wafer W. Accordingly, an increase in temperature of the radially outer edge portion of the wafer W can be curbed. Therefore, an increase in temperature difference within the surface of the wafer W can be further curbed. In addition, during the film formation processing, when reaction products (deposits) accumulate between the wafer contact surfaces 234*s* and the guide contact surface 235*s* in the radial direction on the upper surface of the susceptor 230, the reaction products accumulate on the bottom surface 239*s* positioned below the guide contact surface 235*s*. Accordingly, a situation in which reaction products which have accumulated on the bottom surface 239*s* come into contact with the rear surface Wb of the wafer W can be further curbed. Accordingly, adhesion of reaction products to the rear surface Wb of the wafer W can be further curbed.

According to the third embodiment, the distance in the radial direction between the inner end portion of the wafer support portion 234 in the radial direction and the outer end portion of the wafer support portion 234 in the radial direction is larger than the distance in the radial direction between the inner end portion of the second recessed portion 239 in the radial direction and the outer end portion of the second recessed portion 239 in the radial direction. For this reason, it is easy to increase the width of the wafer support portion 234 in the radial direction, and it is easy to stably support the wafer W by the wafer support portion 234. In addition, since the width of the region in the radial direction in which the wafer W overlaps the wafer support portion 234 when viewed in the vertical direction Z can be increased, it is easy to measure the temperature of a part in the wafer W overlapping the wafer support portion 234 in the vertical direction Z by the first temperature sensor 71.

According to at least one embodiment described above, the vapor phase growth apparatus is a vapor phase growth apparatus for forming a film on a surface of a wafer. The vapor phase growth apparatus of the embodiment has the susceptor supporting a wafer from below, the drive unit rotating the susceptor around the rotation axis extending in the vertical direction, the ring-shaped wafer guide supported by the susceptor from below and surrounding the outer edge of the wafer, the first temperature sensor and the second temperature sensor capable of measuring the temperature of the wafer, the first heating portion and the second heating portion capable of heating the susceptor, and the control unit controlling the first heating portion and the second heating portion. The susceptor has the wafer support portion supporting the wafer from below, the guide support portion positioned on the outward side from the wafer support portion in the radial direction about the rotation axis and supporting the wafer guide from below, and the inward portion positioned on the radially inward side from the wafer support portion. The wafer support portion has the wafer contact surface coming into contact with the wafer. The upper surface of the inward portion is positioned below the wafer contact surface. The guide support portion has the guide contact surface coming into contact with the wafer guide. The wafer contact surface is positioned above the guide contact surface. The first heating portions is positioned on the radially outward side from the second heating portion. During the film formation processing of forming a film on a surface of the wafer, the control unit measures the temperature of a part in the wafer overlapping the wafer support portion when viewed in the vertical direction by the first temperature sensor, measures the temperature of a part in the wafer overlapping the inward portion when viewed in the vertical direction by the second temperature sensor, and controls the first heating portion and the second heating portion on the basis of measurement results of the first temperature sensor and measurement results of the second temperature sensor. Accordingly, as described above, while entry of the wafer between the susceptor and the wafer guide is curbed, an increase in temperature difference within the wafer can be curbed, and therefore degradation of the film formation accuracy of the film formed on the surface of the wafer can be favorably curbed.

During the film formation processing, the control unit may control the first heating portion and the second heating portion in any manner as long as the first heating portion and the second heating portion are controlled on the basis of measurement results of the first temperature sensor and measurement results of the second temperature sensor. The wafer contact surface may be disposed at the same position in the vertical direction as the end portion on the upward side in the end portion of the wafer guide on the radially inward side or may be positioned above the end portion on the upward side in the end portion of the wafer guide on the radially inward side as long as it is positioned above the guide contact surface. The upper surface of the inward portion positioned on the inward side in the radial direction from the wafer support portion may be disposed at the same position as the guide contact surface in the vertical direction or may be positioned above the guide contact surface as long as it is positioned below the wafer contact surface. A plurality of wafer support portions may be provided with an interval therebetween in the circumferential direction around the rotation axis. Any kind of temperature sensors may be adopted as the first temperature sensor and the second temperature sensor as long as the temperature of a wafer can be measured. The first heating portions and the second heating portion may be disposed in any manner as long as the first heating portions is positioned on the radially outward side from the second heating portion. The inward portion of the susceptor may not have the movable portion capable of moving in the vertical direction.

While certain embodiments have been described, these embodiments have been presented as exemplary examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A vapor phase growth apparatus for forming a film on a surface of a wafer, the device comprising:
- a susceptor supporting the wafer from below;
- a drive unit rotating the susceptor around a rotation axis extending in a vertical direction;
- a ring-shaped wafer guide supported by the susceptor from below and surrounding an outer edge of the wafer;
- a first temperature sensor and a second temperature sensor capable of measuring a temperature of the wafer;
- a first heating portion and a second heating portion capable of heating the susceptor; and
- a control unit controlling the first heating portion and the second heating portion,
- wherein the susceptor has
  - a wafer support portion supporting the wafer from below,
  - a guide support portion positioned on an outward side from the wafer support portion in a radial direction about the rotation axis and supporting the wafer guide from below, and
  - an inward portion positioned on an inward side in the radial direction from the wafer support portion,
- the wafer support portion has a wafer contact surface coming into contact with the wafer, an upper surface of the inward portion is positioned below the wafer contact surface, the guide support portion has a guide contact surface coming into contact with the wafer guide, the wafer contact surface is positioned above the guide contact surface, the first heating portion is positioned on the outward side in the radial direction from the second heating portion, and during film formation processing of forming a film on a surface of the wafer, the control unit measures a temperature of a part in the wafer overlapping the wafer support portion when viewed in the vertical direction by the first temperature sensor, measures a temperature of a part in the wafer overlapping the inward portion when viewed in the vertical direction by the second temperature sensor, and controls the first heating portion and the second heating portion on the basis of measurement results of the first temperature sensor and measurement results of the second temperature sensor.

2. The vapor phase growth apparatus according to claim 1, wherein during the film formation processing, the control unit controls the first heating portion and the second heating portion such that a difference between a temperature measured by the first temperature sensor and a temperature measured by the second temperature sensor becomes equal to or smaller than a predetermined value.

3. The vapor phase growth apparatus according to claim 1, wherein the wafer contact surface is positioned below an end portion on an upward side on an inner circumferential surface of the wafer guide.

4. The vapor phase growth apparatus according to claim 1, wherein the upper surface of the inward portion is positioned below the guide contact surface.

5. The vapor phase growth apparatus according to claim 1, wherein the inward portion has a movable portion capable of moving in the vertical direction, and during the film formation processing, the control unit measures a temperature of a part in the wafer positioned on the inward side in the radial direction from an outer edge of the movable portion in the radial direction and on the outward side in the radial direction from the rotation axis by the second temperature sensor.

6. The vapor phase growth apparatus according to claim 1, wherein at least a part of the first heating portion overlaps the wafer support portion when viewed in the vertical direction.

7. The vapor phase growth apparatus according to claim 1, wherein at least a part of the second heating portion overlaps the inward portion when viewed in the vertical direction.

8. The vapor phase growth apparatus according to claim 1, wherein the wafer contact surface has an inclined surface positioned downward toward the inward side in the radial direction, and during the film formation processing, the control unit measures a temperature of a part in the wafer overlapping the inclined surface when viewed in the vertical direction by the first temperature sensor.

9. The vapor phase growth apparatus according to claim 1, wherein the wafer support portion has a plurality of first recessed portions recessed downward from an upward surface of the wafer support portion and has a ring shape surrounding the rotation axis, and the plurality of first recessed portions are disposed with an interval therebetween in a circumferential direction around the rotation axis when viewed in the vertical direction.

10. The vapor phase growth apparatus according to claim 1, wherein the susceptor has a second recessed portion recessed downward between the wafer support portion and the guide support portion in the radial direction, and a bottom surface of the second recessed portion is positioned below the guide contact surface.

11. The vapor phase growth apparatus according to claim 10, wherein a distance in the radial direction between an inner end portion of the wafer support portion in the radial direction and an outer end portion of the wafer support portion in the radial direction is larger than a distance in the radial direction between an inner end portion of the second recessed portion in the radial direction and an outer end portion of the second recessed portion in the radial direction.

12. A film formation method of forming a film on a surface of a wafer by a vapor phase growth apparatus, the method comprising:

film formation processing of forming a film on a surface of the wafer, wherein the vapor phase growth apparatus includes a susceptor supporting the wafer from below, a drive unit rotating the susceptor around a rotation axis extending in a vertical direction, a ring-shaped wafer guide supported by the susceptor from below and surrounding an outer edge of the wafer, a first temperature sensor and a second temperature sensor capable of measuring a temperature of the wafer, and a first heating portion and a second heating portion capable of heating the susceptor, the susceptor has a wafer support portion supporting the wafer from below, a guide support portion positioned on an outward side from the wafer support portion in a radial direction about the rotation axis and supporting the wafer guide from below, and an inward portion positioned on an inward side in the radial direction from the wafer support portion, the wafer support portion has a wafer contact surface coming into contact with the wafer, an upper surface of the inward portion is positioned below the wafer contact surface, the guide support portion has a guide contact surface coming into contact with the wafer guide, the wafer contact surface is positioned above the guide contact surface, the first heating portion is positioned on the outward side in the radial direction from the second heating portion, and the film formation processing includes measuring a temperature of a part overlapping the wafer support portion in the wafer when viewed in the vertical direction by the first temperature sensor, measuring a temperature of a part overlapping the inward portion in the wafer when viewed in the vertical direction by the second temperature sensor, and controlling the first heating portion and the second heating portion on the basis of measurement results of the first temperature sensor and measurement results of the second temperature sensor.

13. The film formation method according to claim 12, wherein the film formation processing includes controlling the first heating portion and the second heating portion such that a difference between a temperature measured by the first temperature sensor and a temperature measured by the second temperature sensor becomes equal to or smaller than a predetermined value.

14. The film formation method according to claim 12, wherein the inward portion has a movable portion capable of moving in the vertical direction, and the film formation processing includes measuring a temperature of a part positioned on the inward side in the radial direction from an outer edge of the movable portion in the radial direction in the wafer and on the outward side in the radial direction from the rotation axis by the second temperature sensor.

15. The film formation method according to claim 12, wherein the wafer contact surface has an inclined surface positioned downward toward the inward side in the radial direction, and the film formation processing includes measuring a temperature of a part overlapping the inclined surface in the wafer when viewed in the vertical direction by the first temperature sensor.

* * * * *